(12) United States Patent
Glushkov et al.

(10) Patent No.: US 9,307,624 B2
(45) Date of Patent: Apr. 5, 2016

(54) LITHOGRAPHIC APPARATUS

(75) Inventors: Denis Alexandrovich Glushkov, Witten (DE); Vadim Yevgenyevich Banine, Helmond (NL); Vladimir Vitalevich Ivanov, Moscow (RU); Konstantin Nikolaevich Koshelev, Troitsk (RU); Givi Georgievich Zukakishvili, Troitsk (RU); Vladimir Mihailovitch Krivtsun, Troitsk (RU); Yurii Victorovitch Sidelnikov, Troitsk (RU); Kurt Gielissen, Eindhoven (NL); Oleg Yakushev, Korolev (RU)

(73) Assignee: ASML NETHERLANDS B.V., Veldhoven (NL)

( * ) Notice: Subject to any disclaimer, the term of this patent is extended or adjusted under 35 U.S.C. 154(b) by 1890 days.

(21) Appl. No.: 12/484,812

(22) Filed: Jun. 15, 2009

(65) Prior Publication Data

US 2010/0002211 A1   Jan. 7, 2010

Related U.S. Application Data

(60) Provisional application No. 61/129,283, filed on Jun. 16, 2008.

(51) Int. Cl.
*G21K 5/04* (2006.01)
*H05G 2/00* (2006.01)
*G03F 7/20* (2006.01)

(52) U.S. Cl.
CPC ............ *H05G 2/003* (2013.01); *G03F 7/70033* (2013.01); *H05G 2/008* (2013.01)

(58) Field of Classification Search
USPC .......... 250/493.1, 503.1, 504 R; 315/111.01, 315/111.11, 111.21, 111.31, 111.71
See application file for complete search history.

(56) References Cited

U.S. PATENT DOCUMENTS

| | | | |
|---|---|---|---|
| 6,586,757 B2 | 7/2003 | Melnychuk et al. | |
| 6,933,510 B2 | 8/2005 | Zukavishvili et al. | |
| 6,972,421 B2 | 12/2005 | Melnychuk et al. | |
| 7,180,081 B2 | 2/2007 | Walker et al. | |
| 7,368,741 B2 | 5/2008 | Melnychuk et al. | |
| 7,439,530 B2 * | 10/2008 | Ershov ................... | H05G 2/008 250/492.2 |
| 7,528,395 B2 | 5/2009 | Koshelev et al. | |
| 7,619,232 B2 | 11/2009 | Schmidt et al. | |
| 7,642,533 B2 | 1/2010 | Partio et al. | |

(Continued)

FOREIGN PATENT DOCUMENTS

| | | |
|---|---|---|
| JP | 2001-160499 | 6/2001 |
| JP | 2005-522839 | 7/2005 |

(Continued)

OTHER PUBLICATIONS

English translation of Japanese Office Action for Japanese Patent Application No. 2009-138240 mailed on Dec. 13, 2011.

*Primary Examiner* — Nicole Ippolito
(74) *Attorney, Agent, or Firm* — Pillsbury Winthrop Shaw Pittman LLP

(57) ABSTRACT

A discharge produced plasma radiation source includes a laser beam pulse generator configured to provide a laser beam pulse to trigger a pinch in a plasma of the discharge produced plasma radiation source. The laser beam pulse generator is arranged to provide a laser beam pulse having an energy greater than an optimum laser beam pulse energy that corresponds to a maximum output of a given wavelength of radiation for a given discharge energy.

15 Claims, 4 Drawing Sheets

(56) References Cited

U.S. PATENT DOCUMENTS

| | | |
|---|---|---|
| 8,040,030 B2 | 10/2011 | Jonkers et al. |
| 2004/0105082 A1 | 6/2004 | Koshelev et al. |
| 2004/0108465 A1* | 6/2004 | Bakker et al. ............... 250/492.1 |
| 2004/0108473 A1* | 6/2004 | Melnychuk ............ B82Y 10/00 250/504 R |
| 2004/0135517 A1* | 7/2004 | Schriever ............... H05G 2/003 315/111.21 |
| 2007/0069159 A1 | 3/2007 | Banine et al. |
| 2008/0017810 A1 | 1/2008 | Frijns |

FOREIGN PATENT DOCUMENTS

| | | |
|---|---|---|
| JP | 2007-515741 | 6/2007 |
| JP | 2007-305992 | 11/2007 |
| WO | 2007/121142 A1 | 10/2007 |
| WO | 2007/135587 | 11/2007 |
| WO | 2008/010710 | 1/2008 |

* cited by examiner

LITHOGRAPHIC APPARATUS

CROSS-REFERENCE TO RELATED APPLICATIONS

This application claims the benefit of priority from U.S. Provisional Patent Application No. 61/129,283, filed on Jun. 16, 2008, the content of which is incorporated by reference in its entirety.

FIELD

The present invention relates to a discharge produced plasma (DPP) radiation source and a method of producing radiation using a discharge produced plasma radiation source, and in particular, although not restricted to, a source and method for use in lithography.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to be able to project ever smaller structures onto substrates, it has been proposed to use extreme ultraviolet radiation (EUV) having a wavelength within the range of 5-20 nm, for example within the range of 13-14 nm. It has further been proposed that radiation with a wavelength of less than 10 nm could be used, for example 6.7 nm or 6.8 nm. In the context of lithography, wavelengths of less than 10 nm are sometimes referred to as 'beyond EUV', or as 'soft x-rays'.

Extreme ultraviolet radiation and beyond EUV radiation may be produced using a discharge produced plasma radiation source. A plasma is created by, for example, passing an electrical discharge through a suitable material (e.g. a gas or vapour). The resulting plasma may be compressed (i.e. be subjected to a pinch effect), at which point electrical energy is converted into electromagnetic radiation in the form of extreme ultraviolet radiation (or beyond EUV radiation). The radiation emitted from the discharge produced plasma radiation source may be collected using a collector, such as a mirrored grazing incidence collector, which receives the extreme ultraviolet radiation and focuses the radiation into a beam.

It has been observed that discharge produced plasma radiation sources produced ions with kinetic energies up to 75 keV (such ions sometimes being referred to as 'high energy ions' or 'fast ions'). For example, a discharge produced plasma radiation source that has tin electrodes has been observed producing fast tin (Sn) ions with energies up to 75 keV. Ions having energies up to 75 keV are known to sputter objects that they come into contact with, for example the grazing incidence collector referred to above as receiving and focusing into a beam radiation emitted from the discharge produced plasma radiation source. Sputtering of the grazing incidence collector may affect the lifetime of the collector. It is desirable to reduce the sputtering of the collector, and therefore increase its lifetime. This is because it is desirable to minimize the costs associated with replacing or repairing a collector, and also the down-time in the use of a lithographic apparatus associated with the repair or replacement of the collector.

Existing discharge produced plasma radiation sources, or structures to be used in conjunction with those sources, often employ a debris mitigation scheme. The debris mitigation scheme is employed to reduce the number of particles, ions, etc. that pass from the radiation source into and around the lithographic apparatus. For example, known debris mitigation schemes are employed to reduce the number of fast ions that are incident upon and sputter the grazing incidence collector. Existing debris mitigation schemes utilize a static foil trap filled with argon. However, in order to effectively suppress the passage of fast ions having energies of around 75 keV, the pressure of the argon gas should be at a level which is technically difficult to achieve and sustain. Furthermore, the desired increase in the density of the argon gas decreases the overall transmission of EUV radiation from the discharge produced plasma radiation source through to the lithographic apparatus.

It is therefore an object of the present invention to provide a discharge produced plasma radiation source, and a method of generating radiation using a discharge produced plasma radiation source which reduces the number of fast (high energy) ions that are generated. Desirably, the reduction in the number of fast ions that are generated is greater than any corresponding reduction in the generation or transmission of radiation (e.g. EUV radiation) generated by the discharge produced plasma radiation source.

SUMMARY

According to an aspect of the present invention, there is provided a discharge produced plasma radiation source that includes a laser beam pulse generator (e.g. a laser) configured to provide a laser beam pulse to trigger a pinch in a plasma of the discharge produced plasma radiation source. The discharge produced plasma radiation source has associated with it an optimum laser beam pulse energy that generates a maximum output of a given wavelength of radiation for a given discharge energy. The laser beam pulse generation arrangement is arranged to provide a laser beam pulse which has an energy which is greater than the optimum laser beam pulse energy.

According to an embodiment, there is provided a discharge produced plasma radiation source that includes a laser beam pulse generator configured to provide a laser beam pulse to trigger a pinch in a plasma of the discharge produced plasma radiation source. The laser beam pulse generator is arranged to provide a laser beam pulse having an energy greater than an optimum laser beam pulse energy that corresponds to a maximum output of a given wavelength of radiation for a given discharge energy.

The given wavelength of radiation may be in the range of EUV radiation. The given wavelength of radiation may have a wavelength that is shorter than that of EUV radiation.

The discharge produced plasma radiation source is arranged to increase the discharge energy beyond the given discharge energy if the output of the given wavelength of radiation for the optimum laser beam pulse energy is greater than the output of the given wavelength of radiation for the greater laser beam pulse energy.

The discharge produced plasma radiation source may comprise at least one electrode. The discharge produced plasma radiation source may comprise two electrodes. The discharge produced plasma radiation source may comprise one or more rotating or stationary electrodes. The discharge produced plasma radiation source may comprise electrodes that are separated from each other by a distance in the range of from about 2 mm to about 4 mm.

For a discharge energy of about 2 J, the laser beam pulse generation arrangement may be arranged to provide a laser beam pulse which has an energy greater than about 20 mJ.

For a discharge energy of about 4 J, the laser beam pulse generation arrangement may be arranged to provide a laser beam pulse which has an energy greater than about 30 mJ.

The discharge produced plasma radiation source may be provided with a collector upon which radiation generated by the discharge produced plasma radiation source is arranged to be incident. The collector may be a grazing incidence collector.

The discharge produced plasma radiation source may be arranged to provide radiation to a lithographic apparatus.

According to an aspect of the present invention there is provided a lithographic apparatus arranged to receive radiation generated by the discharge produced radiation source according to an embodiment of the present invention.

According to an aspect of the present invention there is provided a lithographic apparatus provided with a discharge produced radiation source according to an embodiment of the present invention.

In accordance with embodiments of the invention, the lithographic apparatus of the present invention may further include: an illumination system configured to condition a radiation beam, radiation forming the radiation beam being provided by the discharge produced plasma radiation source; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate.

The lithographic apparatus may be provided with a collector upon which radiation generated by the discharge produced plasma radiation source is arranged to be incident. The collector may be a grazing incidence collector.

According to an aspect of the present invention there is provided a method of generating radiation using a discharge produced plasma radiation source. The method includes providing a laser beam pulse to trigger a pinch in a plasma of the discharge produced plasma radiation source. The discharge produced plasma radiation source has an optimum laser beam pulse energy for generating a maximum output of a given wavelength of radiation for a given discharge energy. The energy of the provided laser beam pulse is greater than the optimum laser beam pulse energy.

According to an embodiment, there is provided a lithographic apparatus that includes a discharge produced plasma radiation source that includes a laser beam pulse generator configured to provide a laser beam pulse to trigger a pinch in a plasma of the discharge produced plasma radiation source. The laser beam pulse generator is arranged to provide the laser beam pulse that has an energy greater than an optimum laser beam pulse energy that corresponds to a maximum output of a given wavelength of radiation for a given discharge energy. The apparatus includes an illumination system configured to condition radiation from the discharge plasma radiation source into a radiation beam, and a support constructed to support a patterning device. The patterning device is configured to impart the radiation beam with a pattern in its cross-section to form a patterned radiation beam. The apparatus includes a substrate table constructed to hold a substrate, and a projection system configured to project the patterned radiation beam onto a target portion of the substrate.

According to an embodiment, there is provided a method of generating radiation using a discharge produced plasma radiation source. The method includes triggering a pinch in a plasma of the discharge produced plasma radiation source with a laser beam pulse having an energy greater than an optimum laser beam pulse energy for generating a maximum output of a given wavelength of radiation for a given discharge energy.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
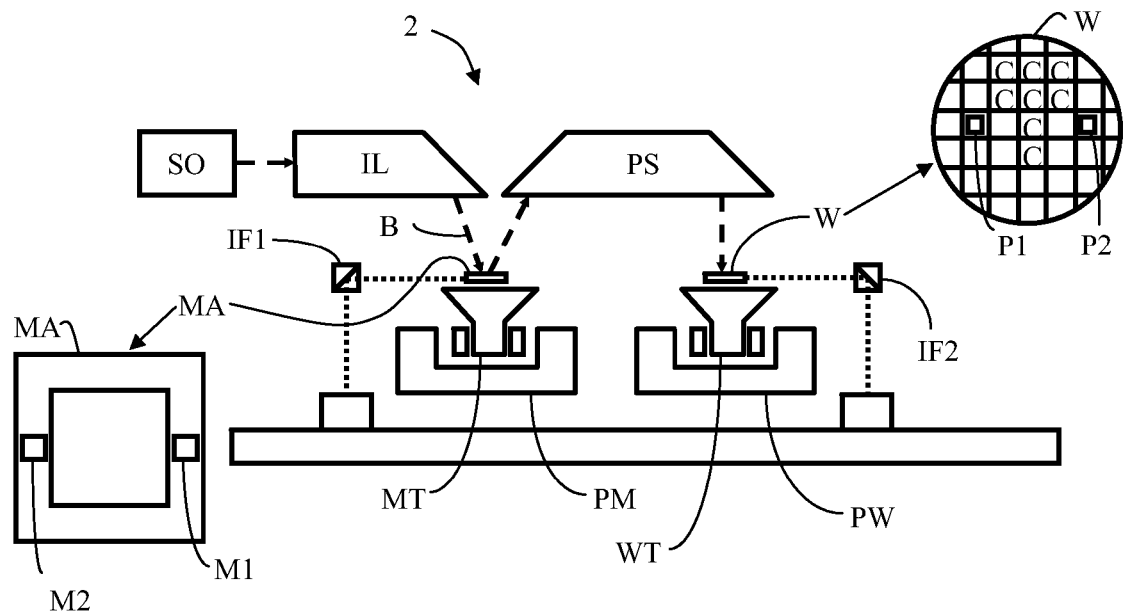
FIG. 1 schematically depicts a lithographic apparatus according to an embodiment of the invention.

FIG. 1 schematically depicts a lithographic apparatus 2 according to an embodiment of the invention. The apparatus 2 comprises: an illumination system (illuminator) IL configured to condition a radiation beam B (e.g. EUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus 2, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

Examples of patterning devices include masks and programmable mirror arrays. Masks are well known in lithography, and typically in an EUV radiation (or beyond EUV) lithographic apparatus would be reflective. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system. Usually, in a EUV (or beyond EUV) radiation lithographic apparatus the optical elements will be reflective. However, other types of optical element may be used. The optical elements may be in a vacuum. Any use of the term "projection lens" herein may be considered as synonymous with the more general term "projection system".

As here depicted, the apparatus 2 is of a reflective type (e.g. employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities. In such cases, the source is not considered to form part of the lithographic apparatus and the radiation beam is passed from the source SO to the illuminator IL with the aid of a beam delivery system comprising, for example, suitable directing mirrors and/or a beam expander. In other cases the source may be an integral part of the lithographic apparatus. The source SO and the illuminator IL, together with the beam delivery system if required, may be referred to as a radiation system.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator IL may be used to condition the radiation beam B to have a desired uniformity and intensity distribution in its cross-section.

The radiation beam B is incident on the patterning device (e.g., mask MA), which is held on the support structure (e.g., mask table MT), and is patterned by the patterning device. Having been reflected by the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus 2 could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
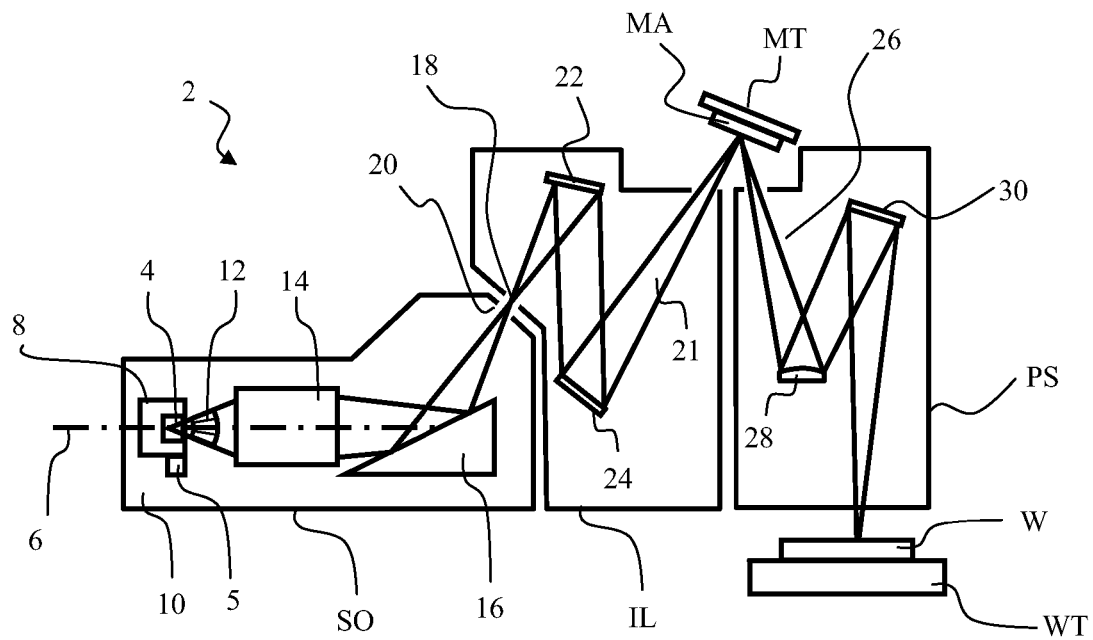
FIG. 2 is a more detailed schematic illustration of the lithographic apparatus shown in FIG. 1.

FIG. 2 shows the lithographic apparatus 2 in more detail, including a radiation source SO, an illuminator IL (sometimes referred to as an illumination system), and the projection system PS. The radiation source SO includes a radiation emitter 4 in the form of a discharge produced plasma radiation source. EUV radiation may be produced by a gas or vapour, such as Xe gas or Li vapour in which a very hot plasma is created in order to emit radiation in the EUV radiation range of the electromagnetic spectrum. The very hot plasma is created by causing a partially ionized plasma of an electrical discharge to collapse onto an optical axis 6. The location and/or timing of the generation of a highly density plasma region (or "pinch"), and therefore of the collapse can be controlled by the use of one or more laser beam pulses as described in United States Patent Application Publication No. 2004/0105082. The laser beam pulses are generated by a laser 5 (i.e. a laser beam pulse generation arrangement, or a laser beam pulse generator). Partial pressures of, for example, 10 Pa of Xe or Li vapour or any other suitable gas or vapour may be desirable for efficient generation of the radiation.

The radiation emitted by radiation emitter 4 is passed from a source chamber 8 into a collector chamber 10. The collector chamber 10 includes a contamination trap 12 and a grazing incidence collector 14 (shown schematically as a rectangle). Radiation allowed to pass through the collector 14 is reflected off a grating spectral filter 16 to be focused in a virtual source point 18 at an aperture 20 in the collector chamber 10. From collector chamber 10, a beam of radiation 21 is reflected in the illuminator IL via first and second reflectors 22, 24 onto a reticle or mask MA positioned on reticle or mask table MT. A patterned beam of radiation 26 is formed which is imaged in projection system PS via first and second reflective elements 28, 30 onto a substrate W held on a substrate table WT.

It will be appreciated that more or fewer elements than shown in FIG. 2 may generally be present in the source SO, illumination system IL, and projection system PS. For instance, in some embodiments the lithographic apparatus 2 may also comprise one or more transmissive or reflective spectral purity filters. More or less reflective elements may be present in a lithographic apparatus.

As discussed above, the generation of high energy ions (that is, ions having a kinetic energy of, for example, greater than 10 keV and up to and exceeding 75 keV) are known to cause damage to, for example, the grazing incidence collector of an EUV lithographic apparatus. For example, damage can be caused by the high energy ions sputtering the grazing incidence collector of the EUV lithographic apparatus. One solution to this potential problem involves providing an increased density of a buffer gas such as argon between the discharge produced plasma radiation source and the collector. However, this solution may be technically difficult to implement and is known to significantly reduce the transmission of EUV radiation from the source into the lithographic apparatus. In accordance with an embodiment of the present invention, instead of attempting to suppress or prevent the transmission of high energy ions into the lithographic apparatus, the discharge produced plasma radiation source is controlled such that fewer high energy ions are generated, while at the same time maintaining a satisfactory level of EUV radiation generation and transmission into the lithographic apparatus.

Principles and embodiments of the present invention will now be described in relation to FIGS. 3 to 7.

Figure 3:
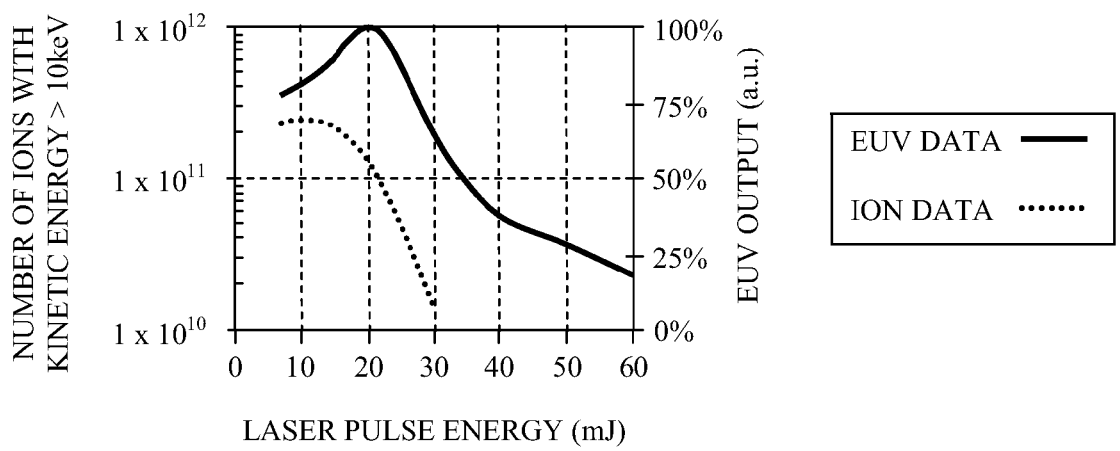
FIG. 3 is a graph schematically depicting a variation in the number of high energy ions generated by a discharge produced plasma radiation source operating at a discharge energy of 2 J, together with a variation in the generation of EUV radiation by the radiation source, as a function of laser pulse energy.

FIG. 3 is a graph schematically depicting the effects of the variation in the energy of the laser beam pulse or pulses used to trigger the pinch (as described above) on two properties of the discharge produced plasma radiation source. The first property is the number of ions generated per laser beam pulse by the discharge produced plasma radiation source in $2\pi$ steradians and which have a kinetic energy greater than 10 keV (i.e. high energy ions). The second property is the (normalized) generation of EUV radiation per laser beam pulse by the discharge produced plasma radiation source. The relationships depicted in the graph are for a discharge produced plasma radiation source operating with a discharge energy of 2 J. The discharge produced plasma radiation source can, of course, operate at different discharge energies, as will be described in more detail below.

FIG. 3 shows that the EUV output varies as a function of the laser beam pulse energy. In particular, it can be seen there is an optimum laser beam pulse energy of 20 mJ at which the EUV output of the discharge produced plasma radiation source is maximized. In existing arrangements, it is known to use the optimum laser beam pulse energy to trigger the pinch effect in order to achieve the maximum possible EUV radiation generation. One reason for this is that the intensity of an EUV radiation beam reduces as it passes through the lithographic apparatus. It is therefore desirable to ensure that as much EUV radiation is generated as possible at the source so that as much possible EUV radiation is available to be projected onto and apply a pattern to a substrate.

In accordance with an embodiment of the present invention, it has been realized that the relationship between the laser beam pulse energy and the EUV output is not the same as the relationship between the laser beam pulse energy and the number of high energy ions generated by the discharge produced plasma radiation source. For instance, it can be seen from FIG. 3 that although the maximum EUV output can be achieved when the laser beam pulse energy is 20 mJ, the number of high energy ions generated is not, for example, at a minimum. Therefore, while a laser beam pulse energy of 20 mJ may be an optimum value for the generation of EUV radiation, it is not an optimum value for the generation (and, for example, minimization) of high energy ions. The difference between the relationships of high energy ion generation and EUV radiation generation for a given laser beam pulse energy can be taken advantage of.

Figure 4:
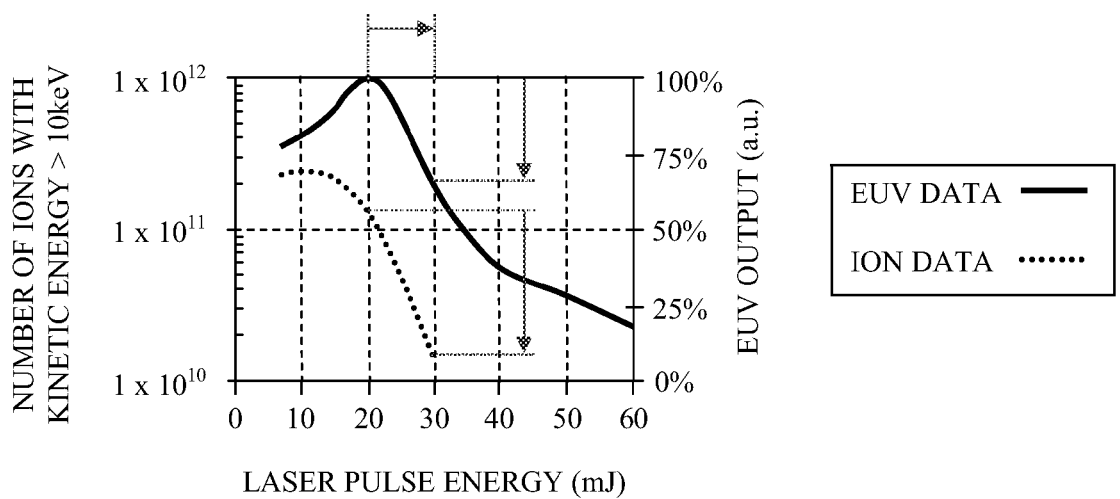
FIG. 4 schematically depicts principles for reducing the generation of high energy ions using the graph of FIG. 3 as a visual aid.

FIG. 4 schematically depicts the same graph as shown in and described with reference to FIG. 3. However, FIG. 4 also includes arrows depicting various changes in the laser pulse energy, and the consequential effects in the generation of EUV radiation and the generation of high energy ions. It can be seen from FIG. 4 that an increase in the laser beam pulse energy from 20 mJ to 30 mJ results in about a ten times reduction in the number of ions generated which have a kinetic energy exceeding 10 keV. At the same time, the EUV radiation generated (i.e. the EUV output) only decreases by about 35%. Thus, it can be seen that by increasing the laser beam pulse energy by 10 mJ (from 20 mJ) the generation of high energy ions has been decreased by a much greater extent than the corresponding decrease in the level of generated EUV radiation.

It will be appreciated from FIG. 4 that by increasing the laser pulse energy beyond the level to achieve a maximum EUV radiation generation, there is a trade off between a reduction in EUV radiation generation and a reduction in the number of high energy ions that are generated. However, since the number of high energy ions generated reduces much more rapidly for a given increase in laser pulse energy than the corresponding decrease in EUV radiation generation, even a slight increase in the laser pulse energy may be sufficient to decrease the number of high energy ions that are generated to a level which significantly increases the life of, for example, the grazing incidence collector mentioned above. Therefore, in accordance with an embodiment of the present invention, for a discharge produced plasma radiation source which employs a laser to trigger a pinch effect, the discharge produced plasma radiation source having associated with it an optimum laser beam pulse energy for which the EUV radiation output is maximized, using a laser beam pulse energy slightly in excess of the optimum can have advantages associated with it. For example, the advantages may be the significant decrease in the number of high energy ions that are generated, with only a slight decrease in the generation of EUV radiation. The present invention also provides a method whereby the optimum value of a laser beam pulse energy is either known or determined in advance, and the laser beam pulse energy is then controlled to be greater than this optimum value. A laser beam pulse generation arrangement (e.g. a laser) may be controlled directly to control the laser beam pulse energy, or the laser beam pulse generation apparatus may be controlled using a controller or the like.

Figure 5:
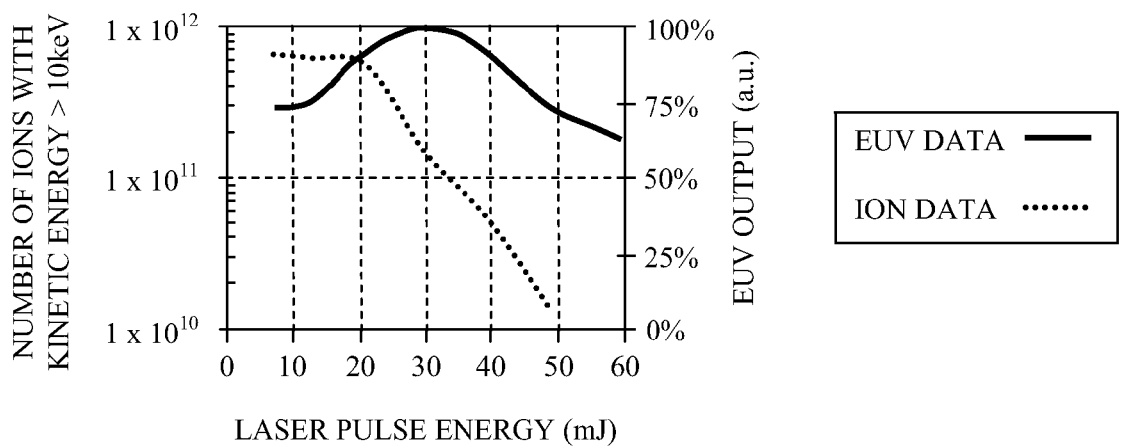
FIG. 5 is a graph schematically depicting a variation in the number of high energy ions generated by discharge produced plasma radiation source operating at a discharge energy of 4 J, together with a variation in the generation of EUV radiation by the radiation source, as a function of laser pulse energy.

FIG. 5 is a graph schematically depicting the same general relationships shown in and described with reference to FIG. 3. However in contrast with the graph of FIG. 3, the graph of FIG. 5 schematically depicts the relationships for the discharge produced plasma radiation source operating at a discharge energy of 4 J. As described in relation to FIG. 3, it can be seen that both the EUV radiation generation and the generation of high energy ions (i.e. ions having a kinetic energy exceeding 10 keV) varies as a function of laser beam pulse energy. In FIG. 5, it can be seen the maximum possible EUV radiation generation is achieved when the laser beam pulse energy is 30 mJ. However, at this laser beam pulse energy, the number of high energy ions is not at, for example, a minimum. Thus, although the laser beam pulse energy of 30 mJ may be an optimum value for the generation of EUV radiation, it is not an optimum value for the generation (and, for example, minimization) of high energy ions.

Figure 6:
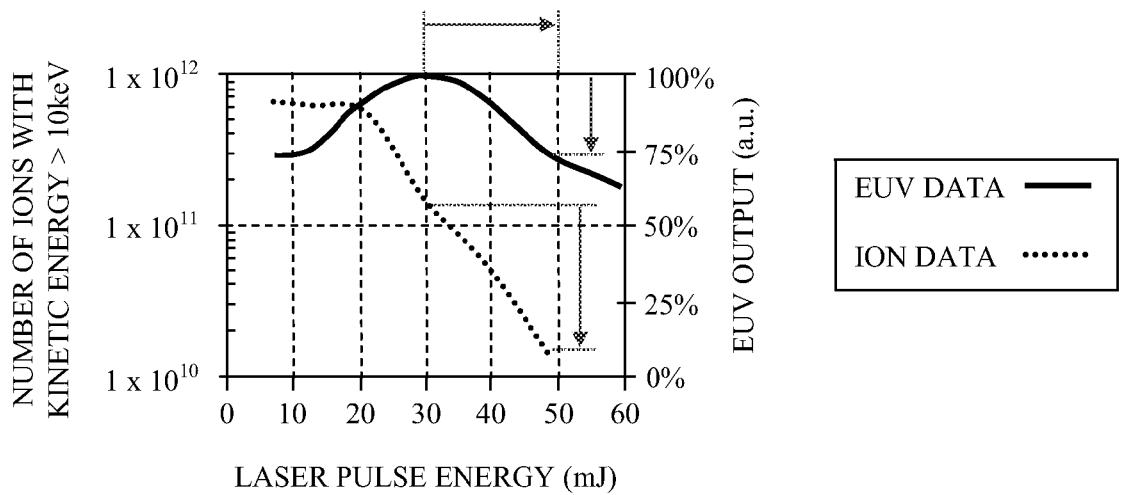
FIG. 6 schematically depicts principles for reducing the generation of high energy ions using the graph of FIG. 5 as a visual aid.

FIG. 6 shows how a change in laser beam pulse energy has a consequential effect on the generation of EUV radiation and the radiation of high energy ions. An increase in laser beam pulse energy from 30 mJ to 50 mJ results in a ten times reduction in the number of high energy ions that are generated by the discharge produced plasma radiation source. At the same time, the generation of EUV radiation is only reduced by 25%. Thus, it will be appreciated that the increase in laser beam pulse energy of 20 mJ (from 30 mJ to 50 mJ) results in a far greater decrease in the number of generated high energy ions that it does in the decrease in EUV radiation generation. This means that, as described in relation to FIGS. 3 and 4, the use of a laser beam pulse energy greater than a laser beam pulse energy that is optimal for the generation of EUV radiation generation may result in a much decreased generation of high energy ions, and a consequential increase in the lifetime of, for example, the grazing incidence collector (or other elements) of an EUV lithographic apparatus.

Figure 7:
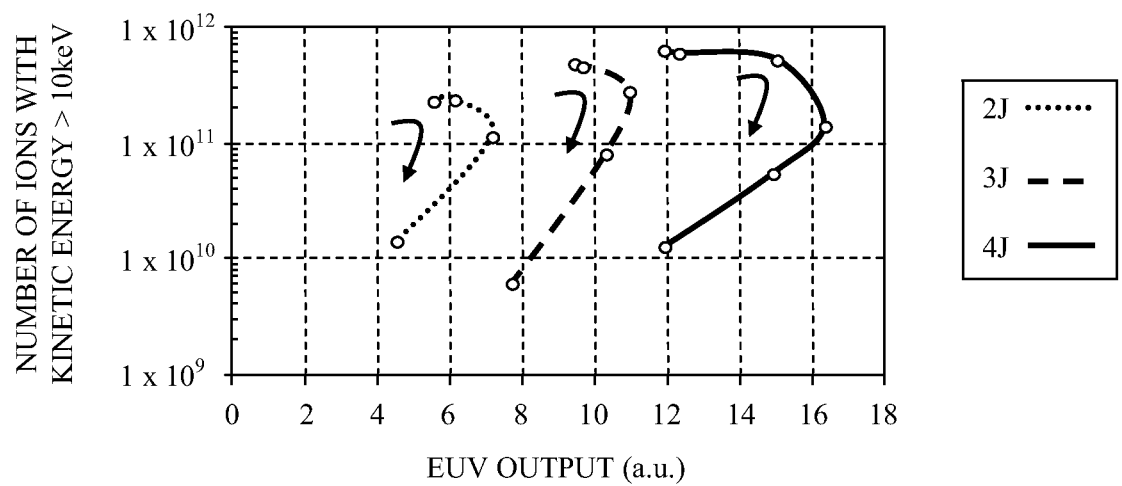
FIG. 7 is a graph schematically depicting the relationship between the generation of high energy ions by a discharge produced plasma radiation source as a function of the EUV radiation output of the source, and how this relationship varies as a function of the discharge energy of the discharge produced plasma radiation source.

FIGS. 3 to 6 have shown that, for a given discharge energy at which the discharge produced plasma radiation source is operating, an increase in the laser beam pulse energy will in general result in a decrease in the EUV radiation that is generated by the discharge produced plasma radiation source. FIG. 7 depicts a relationship between the number of high energy ions (i.e. ions having a kinetic energy exceeding 10 keV) that are generated as a function of the EUV radiation generation of a discharge produced plasma radiation source. The graph depicts three relationships for three different discharge energies at which the discharge produced plasma radiation source can operate: 2 J, 3 J and 4 J. Arrows on the graph depict an increase in the laser beam pulse energy for the relationships for different discharge energies. In a similar manner as described above in relation to the graphs of FIGS. 3 to 6, it can be seen that, for a given discharge energy, the number of high energy ions that are generated can be reduced by increasing the laser beam pulse energy, although this has the associated effect of reducing the EUV output of the discharge produced plasma radiation source. However, it will now be appreciated from FIG. 7 that a reduction in EUV radiation generation can be counteracted by increasing the discharge energy at which the discharge produced plasma radiation source is operating. For instance, it can be seen that for all of the depicted relationships there is a discharge energy, laser beam pulse energy and a corresponding EUV output which results in the same number of high energy ions being generated. This means that it is possible to find a balance between the laser beam pulse energy and the discharge energy of the discharge produced plasma radiation source such that the EUV output does not decrease when the number of generated high energy ions decreases. Furthermore, it can be seen from FIG. 7 that the number of generated high energy ions can be reduced while actually increasing the EUV output of the discharge plasma radiation source. An increase in the discharge energy may alternatively or additionally be used to increase the amount of EUV radiation that the discharge produced plasma radiation source is able to generate.

The discharge produced plasma radiation source may be arranged to increase the discharge energy if the EUV radiation output for the optimum laser beam pulse energy is greater than the EUV radiation output for the increased laser beam pulse energy. The increase in the discharge energy may be undertaken automatically or manually, for example by using a sensor to detect changes in the EUV output and to provide a feedback to the discharge produced plasma radiation source to change (if necessary) the discharge energy. In another example, if the relationships exemplified in FIG. 7 are known in advance, the discharge energy can be set to a specific value as and when the laser beam pulse energy is changed, without the need for an EUV radiation sensor. This example can also be undertaken automatically or manually.

It will be appreciated that exact numerical values shown in FIGS. 3 to 7, and the values used in the description of those Figures are related to the specific discharge produced plasma radiation source used to generate the relationships shown in those figures. For instance, the graphs and relationships depicted in those graphs were obtained using an EUV discharge produced plasma radiation source provided with rotating electrodes. The electrodes could, instead, be stationary. The electrodes were made of tin, but could instead be made of any material suitable for forming an electrode. Laser beam pulses were focused on a cathode surface of the discharge produced plasma radiation source. The gap between the electrodes was 3.5 mm, but could be, for example, anything from about 2 mm to about 4 mm. It will be appreciated that the exact laser beam pulse energies to achieve, for example, an optimum EUV output or high energy ion generation will vary for different configurations, types and even different ages of given discharge produced plasma radiation sources. However, it is believed that the generic principles described above are equally applicable to such other discharge produced plasma radiation sources. That is, for discharge produced plasma radiation sources which are provided with a laser beam pulse pinch trigger, there will be an optimum laser beam pulse energy which results in maximum EUV radiation beam output for a given discharge energy. Increasing the laser beam pulse energy beyond this optimum laser beam pulse energy may result in a reduction in the EUV radiation generation, but also a reduction in the generation of high energy ions. The reduction in the number of high energy ions that are generated may be greater in extent that the reduction in the EUV radiation generation. An increase in the discharge energy for these other discharge produced plasma radiation sources may also be used to counteract the reduction in the EUV radiation generation for a given increase in the laser beam pulse energy. An increase in the discharge energy may result in an increase in the amount of EUV radiation that the discharge produced plasma radiation source is able to generate.

In the embodiments and relationships described above, the laser beam pulses have a wavelength of approximately 1 μm. However, it is the energy of the laser beam pulse that is significant when considering the energy of the ions that are generated from the pulse. Therefore, it will be appreciated that the invention is not limited to the use of laser beam pulses having a wavelength of approximately 1 μm. Other wavelengths may be used.

Although the above description of embodiments of the invention relates to a radiation source which generates EUV radiation (e.g. 5-20 nm), the invention may also be embodied in a radiation source which generates 'beyond EUV' radiation, that is radiation with a wavelength of less than 10 nm. Beyond EUV radiation (sometimes referred to as soft x-rays) may for example have a wavelength of 6.7 nm or 6.8 nm. A radiation source which generates beyond EUV radiation may operate in generally the same manner as the radiation sources described above, possibly with some variation in the materials used to form the plasma from which radiation is generated. The described discharge produced plasma radiation source and/or related method may be used, for example, in a lithographic apparatus or in connection with a lithographic apparatus. The invention may be useful in any discharge produced plasma radiation source or related method of generating radiation, where it is desirable to reduce the number of fast ions that are generated.

The description above is intended to be illustrative, not limiting. Thus, it will be apparent to one skilled in the art that modifications may be made to the invention as described without departing from the scope of the claims set out below.

What is claimed is:

1. A discharge produced plasma radiation source, comprising:
    a laser beam pulse generator configured to provide a laser beam pulse to trigger a pinch in a plasma of the discharge produced plasma radiation source, the laser beam pulse generator being arranged to provide a laser beam pulse having an energy greater than an optimum laser beam pulse energy that corresponds to a maximum output of a given wavelength of radiation for a given discharge energy.

2. The discharge produced plasma radiation source as claimed in claim 1, wherein the given wavelength of radiation is in the range of EUV radiation.

3. The discharge produced plasma radiation source as claimed in claim 1, wherein the given wavelength of radiation has a wavelength that is shorter than that of EUV radiation.

4. The discharge produced plasma radiation source as claimed in claim 1, wherein the discharge produced plasma radiation source is arranged to increase the discharge energy beyond the given discharge energy if the output of the given wavelength of radiation for the optimum laser beam pulse energy is greater than the output of the given wavelength of radiation for the greater laser beam pulse energy.

5. The discharge produced plasma radiation source as claimed in claim 1, wherein, for a discharge energy of about 2 J, the laser beam pulse generator is arranged to provide a laser beam pulse having an energy greater than about 20 mJ.

6. The discharge produced plasma radiation source as claimed in claim 1, wherein, for a discharge energy of about 4 J, the laser beam pulse generator is arranged to provide a laser beam pulse which has an energy greater than about 30 mJ.

7. A lithographic apparatus provided with the discharge produced radiation source of claim 1.

8. The lithographic apparatus of claim 7, further comprising:
    an illumination system configured to condition a radiation beam, radiation forming the radiation beam being provided by the discharge produced plasma radiation source;
    a support constructed to support a patterning device, the patterning device being configured to impart the radiation beam with a pattern in its cross-section to form a patterned radiation beam;
    a substrate table constructed to hold a substrate; and
    a projection system configured to project the patterned radiation beam onto a target portion of the substrate.

9. The lithographic apparatus of claim 7, further comprising a collector upon which radiation generated by the discharge produced plasma radiation source is arranged to be incident.

10. The lithographic apparatus of claim 9, wherein the collector is a grazing incidence collector.

11. A method of generating radiation using a discharge produced plasma radiation source, the method comprising:
    providing a laser beam pulse to trigger a pinch in a plasma of the discharge produced plasma radiation source, the discharge produced plasma radiation source having an optimum laser beam pulse energy for generating a maximum output of a given wavelength of radiation for a given discharge energy,
    wherein the energy of the provided laser beam pulse is greater than the optimum laser beam pulse energy.

12. A lithographic apparatus comprising:
    a discharge produced plasma radiation source, comprising
        a laser beam pulse generator configured to provide a laser beam pulse to trigger a pinch in a plasma of the discharge produced plasma radiation source, the laser beam pulse generator being arranged to provide the laser beam pulse having an energy greater than an optimum laser beam pulse energy that corresponds to a maximum output of a given wavelength of radiation for a given discharge energy;
    an illumination system configured to condition radiation from the discharge plasma radiation source into a radiation beam;

a support constructed to support a patterning device, the patterning device being configured to impart the radiation beam with a pattern in its cross-section to form a patterned radiation beam;

a substrate table constructed to hold a substrate; and a projection system configured to project the patterned radiation beam onto a target portion of the substrate.

13. The lithographic apparatus of claim 12, further comprising a collector upon which radiation generated by the discharge produced plasma radiation source is arranged to be incident.

14. The lithographic apparatus of claim 13, wherein the collector is a grazing incidence collector.

15. A method of generating radiation using a discharge produced plasma radiation source, the method comprising:

triggering a pinch in a plasma of the discharge produced plasma radiation source with a laser beam pulse having an energy greater than an optimum laser beam pulse energy for generating a maximum output of a given wavelength of radiation for a given discharge energy.

* * * * *